United States Patent [19]

Seo

[11] Patent Number: 5,780,926
[45] Date of Patent: Jul. 14, 1998

[54] MULTICHIP PACKAGE DEVICE HAVING A LEAD FRAME WITH STACKED PATTERNED METALLIZATION LAYERS AND INSULATION LAYERS

[75] Inventor: Jeong Woo Seo, Asan, Rep. of Korea

[73] Assignee: Samsung Electronics Co., Ltd., Suwon, Rep. of Korea

[21] Appl. No.: 799,355

[22] Filed: Feb. 14, 1997

[30] Foreign Application Priority Data

Feb. 17, 1996 [KR] Rep. of Korea ............... 96-3953

[51] Int. Cl.$^6$ ............... H01L 23/495; H01L 23/02; H01L 23/34
[52] U.S. Cl. ............... 257/676; 257/686; 257/723
[58] Field of Search ............... 257/676, 723, 257/678, 686

[56] References Cited

U.S. PATENT DOCUMENTS 5,061,990  10/1991  Arakawa et al. ............... 257/678
5,083,189   1/1992  Sawaya ............... 257/723

FOREIGN PATENT DOCUMENTS 4-49650   2/1992  Japan ............... 257/676
5-343608 12/1993  Japan ............... 257/723

*Primary Examiner*—T. M. Arroyo
*Attorney, Agent, or Firm*—Jones & Volentine, L.L.P.

[57] ABSTRACT

A multichip package device includes a lead frame having supporting portions and lead portions for electrically connecting the multichip package with an external electronic device. The multichip package is formed by depositing first and second inner insulation layers on lower and upper surfaces of the lead frame, respectively. Via holes are then formed through the first and the second inner insulation layers. First and second metallization layers are deposited and patterned on lower and upper surfaces of the first and the second inner insulation layers, respectively. First and second outer insulation layers are then deposited on lower and upper surfaces of the first and the second patterned metallization layers, respectively. A plurality of chips, each having an active surface on which a plurality of bonding pads are formed, are attached to lower and upper surfaces of the first and second outer insulation layers. A plurality of bonding wires are connected between the plurality of bonding pads and the lead portions through the via holes and the first and second patterned metallization layers.

9 Claims, 7 Drawing Sheets

MULTICHIP PACKAGE DEVICE HAVING A LEAD FRAME WITH STACKED PATTERNED METALLIZATION LAYERS AND INSULATION LAYERS

BACKGROUND OF THE INVENTION

1. Field of the Invention

The present invention generally relates to a multichip package device, and more particularly, to a multichip package device having a lead frame which has alternatively stacked patterned metallization layers and insulation layers, for electrically interconnecting a plurality of chips.

2. Description of the Related Art

A conventional multichip package has a structure in which a plurality of chips are mounted on a common circuit base and electrically interconnected by conductors in that base. The conductors in the base are usually patterned in multiple layers separated by insulating dielectric materials with via holes formed for interconnection between the layers. The base also provides a mechanical support for the chips.

The conventional multichip package (MCP) can be usually divided into MCP-C, MCP-L and MCP-D classes depending on the kind of the common circuit base employed. MCP-C, MCP-L and MCP-D use a ceramic, a laminate printed circuit base and a thin film deposition layer of metals on deposited dielectrics as the common circuit base, respectively.

The multichip package has some advantages in that it can increase the performance and system speed of the package as well as reducing the overall size. In addition, it can increase the number of the interconnections within a given area and reduce the number of the external connections, for a given system function. It is anticipated that the multichip package device will be employed in a wide range of the systems in the future as a result of the above.

However, the conventional multichip package has some drawbacks, namely, high production costs and complicated manufacturing processes, since it needs a separate common circuit base for interconnecting a plurality of chips.

SUMMARY OF THE INVENTION

Accordingly, it is the object of the present invention to provide a multichip package device using the lead frame for interconnecting a plurality of chips rather than an expensive and complicated circuit base.

The foregoing object and other advantages are achieved according to a significant aspect of the present invention through a provision of a multichip package device which comprises: a lead frame having supporting portions and lead portions, the lead portions comprising inner leads and outer leads for electrically connecting the multichip package with an external electronic device; first and second inner insulation layers deposited on lower and upper surfaces of the lead frame, respectively; via holes formed through the first and the second inner insulation layers; first and second metallization layers deposited and patterned on lower and upper surfaces of the first and the second inner insulation layers, respectively; first and second outer insulation layers deposited on lower and upper surfaces of the first and the second patterned metallization layers, respectively; a plurality of chips, each having an active surface on which a plurality of bonding pads are formed, and wherein backsides of the chips are attached to lower and upper surfaces of the first and second outer insulation layers; a plurality of bonding wires connected between the plurality of bonding pads and the inner leads through the via holes and the first and second patterned metallization layers; and an encapsulant for encapsulating the chips, the supporting portions and the inner leads of the lead portions.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 1 is a perspective view showing a first inner insulation layer deposited on a lower surface of a raw material for a lead frame;

FIG. 2 is a cross sectional view taken along the line 2—2' of FIG. 1;

FIG. 3 is a perspective view showing the lead frame patterned with a conventional photolithography technique;

FIG. 4 is a cross sectional view taken along the line 4—4' of FIG. 3;

FIG. 5 is a perspective view showing a second inner insulation layer deposited on the upper surface of the patterned lead frame;

FIG. 6 is a cross sectional view taken along the line 6—6' of FIG. 5;

FIG. 7 is a perspective view showing the lead frame in which via holes are formed through the first and the second inner insulation layers respectively;

FIG. 8 is a cross sectional view taken along the line 8—8' of FIG. 7;

FIG. 9 is a cross sectional view showing the lead frame in which first and second metallization layers are deposited on the lower and the upper surfaces of the first and the second inner insulation layers respectively;

FIG. 10 is a cross sectional view showing the lead frame in which the metallization layers are patterned so as to leave only desired portions of the metallization layers, thereby forming first and second patterned metallization layers;

FIG. 11 is a cross sectional view showing the lead frame in which first and second outer insulation layers used as passivation layers are deposited on the lower and the upper surfaces of the first and the second patterned metallization layers respectively;

FIG. 12 is a cross sectional view showing the lead frame in which bonding areas of the first and the second patterned metallization layers are exposed to the outside by selectively removing the outer insulation layers;

DETAILED DESCRIPTION OF THE PREFERRED EMBODIMENTS

Preferred embodiments of the present invention will be described below with reference to the accompanying drawings.

FIGS. 1 through 12 are views for illustrating the manufacturing steps of a lead frame according to the present invention.

Figure 1:
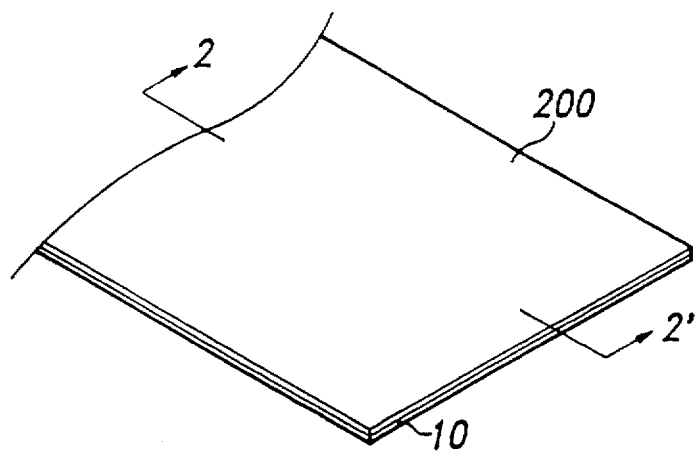
FIGS. 1 through 12 are views for illustrating the manufacturing steps of the lead frame according to the present invention, and, more specifically.
Figure 2:
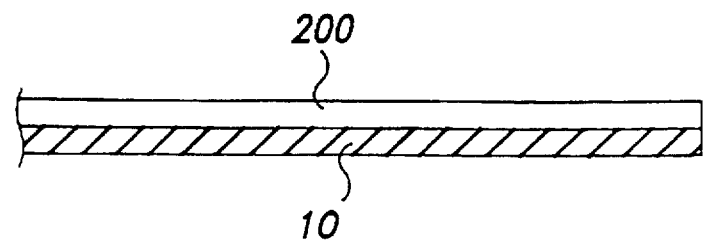

First, a raw material 200 made of copper is prepared for a lead frame. Then, a photo resist is uniformly applied on the lower surface of the raw material 200 to a thickness of about 50 µm, so that a first inner insulation layer 10 is formed as shown in FIG. 1. FIG. 2 is a cross sectional view taken along the line 2—2' of FIG. 1. Herein, the photo resist may be any of the dielectric materials employed in conventional photolithography processes.

Figure 3:
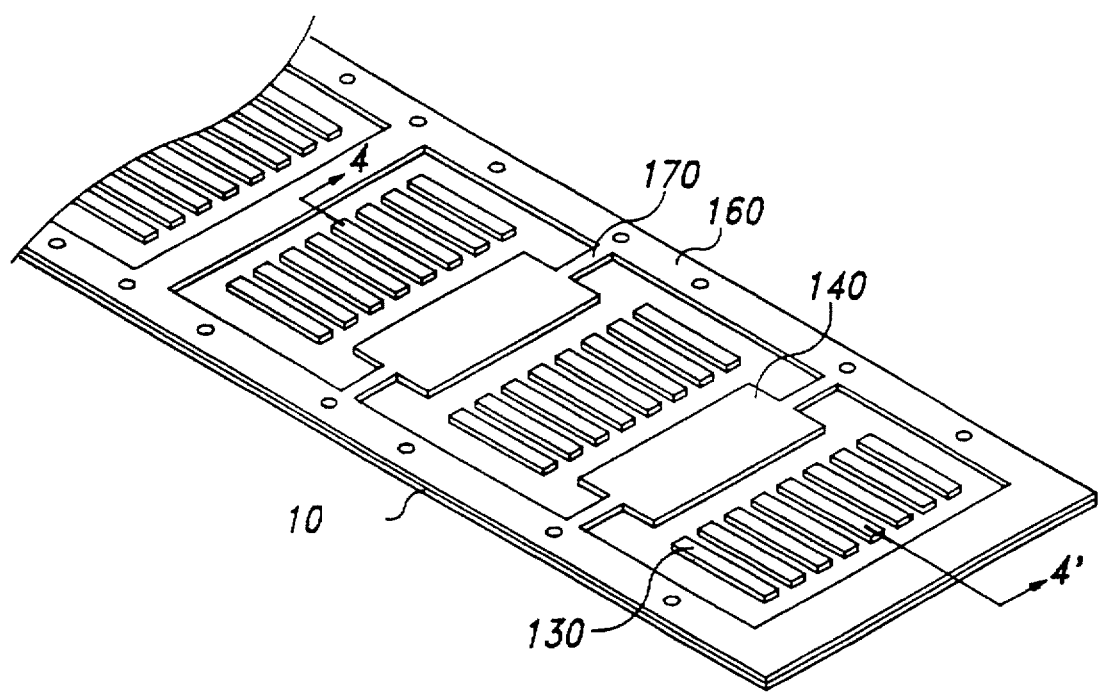
Figure 4:
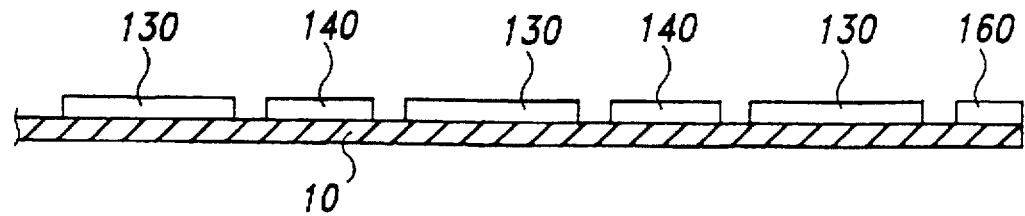

The raw material 200 is then patterned with a conventional photolithography technique so that only desired portions of the raw material 200 remain, thereby forming a patterned lead frame as shown in FIG. 3. FIG. 4 is a cross sectional view taken along the line 4—4' of FIG. 3. This manufacturing step should be controlled so that the first inner insulation layer 10 is not etched. Supporting portions 140 are disposed in the central region of the upper surface of the first inner insulation layer 10 and a plurality of leads 130 are coplanar with the supporting portions 140. Lead frame selvages 160 are formed on the edge of the patterned lead frame and the supporting portions 140 are mechanically and integrally connected to the lead frame selvages 160 through tiebars 170.

Figure 5:
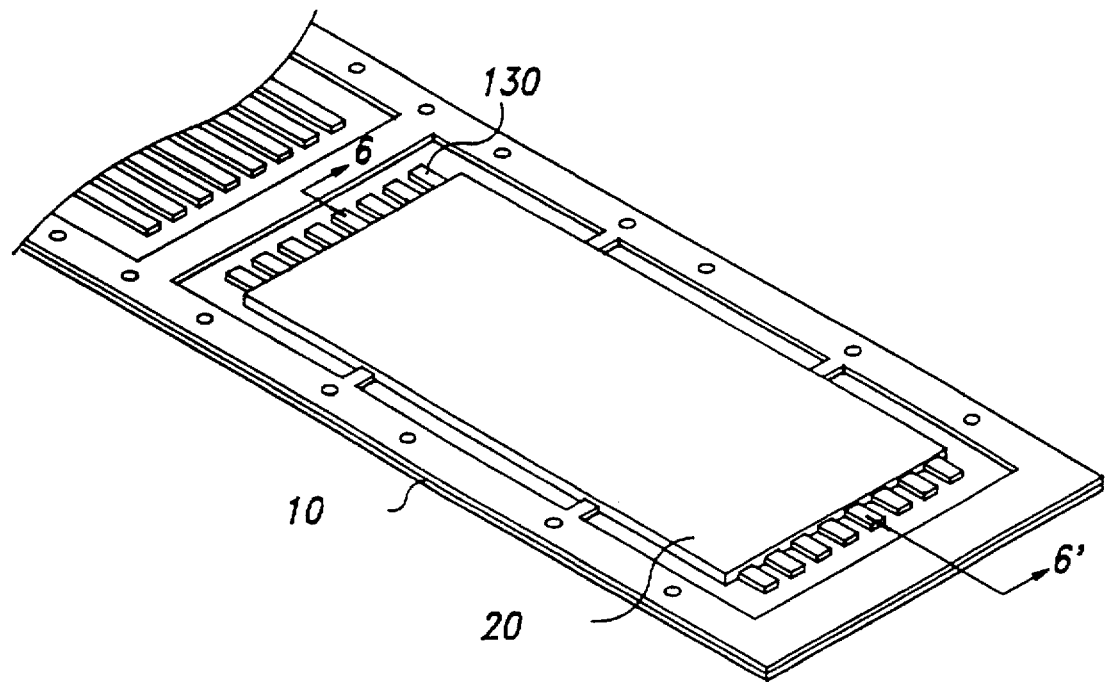
Figure 6:
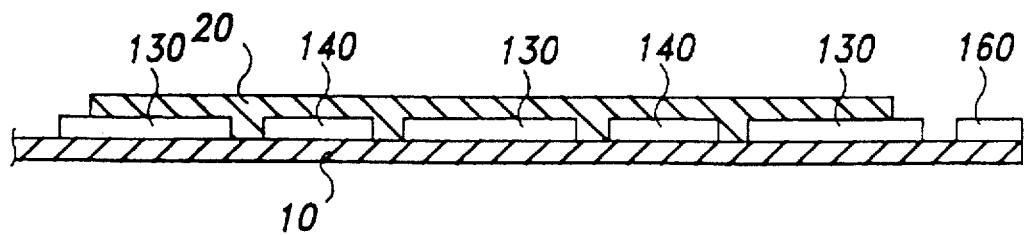
Figure 7:
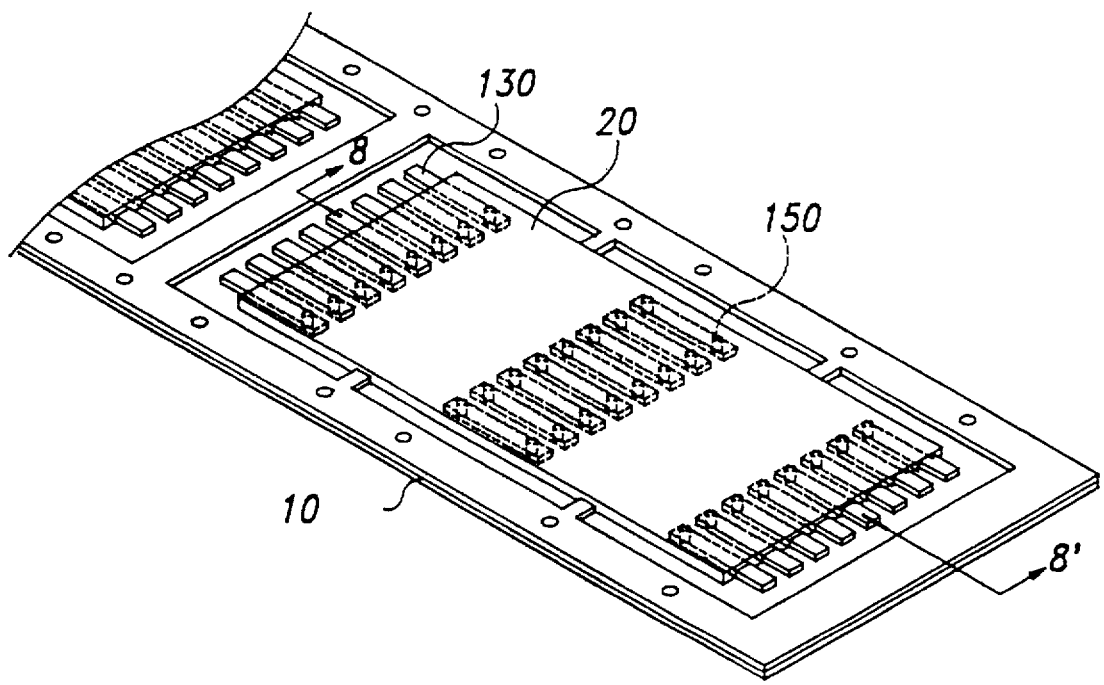
Figure 8:
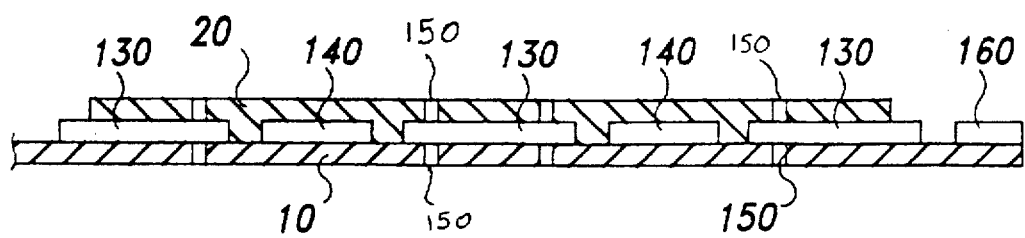

The photo resist is applied again on the upper surface of the patterned lead frame, so that a second inner insulation layer 20 is formed as shown in FIG. 5. FIG. 6 is a cross sectional view taken along the line 6—6' of FIG. 5. Then, via holes 150 are formed through the first and the second inner insulation layers 10 and 20, respectively, as shown in FIG. 7, with a photolithography technique. FIG. 8 is a cross sectional view taken along the line 8—8' of FIG. 7. Herein, the via holes 150 are electrically interconnected with the leads 130 disposed between the first and the second inner insulation layers 10 and 20 by plating the inner walls of the via holes 150 with a conductive material, such as copper.

Figure 9:
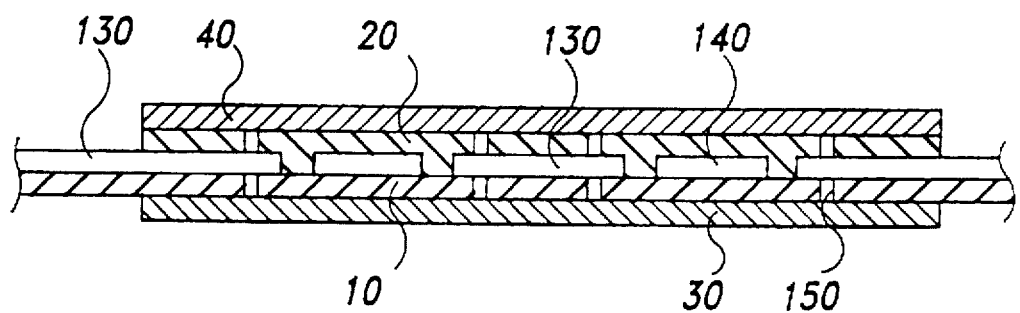
Figure 10:
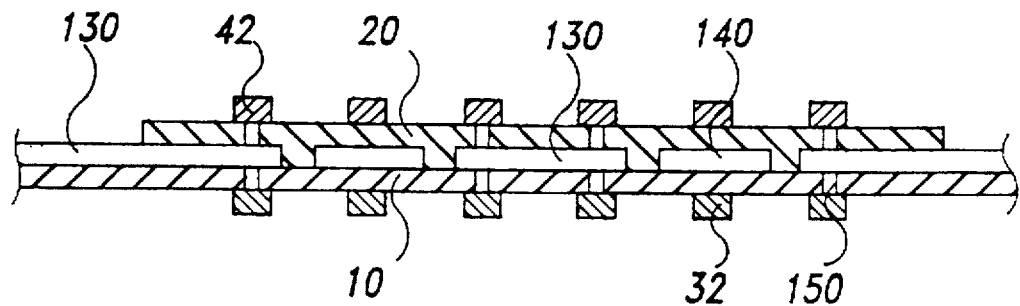

FIG. 9 is a cross sectional view showing that first and second metallization layers 30 and 40 that are respectively deposited on the lower and the upper surfaces of the first and the second inner insulation layers 10 and 20. The metallization layers 30 and 40 are then patterned so as to leave only desired portions of the first and the second metallization layers 30 and 40, thereby forming first and second patterned metallization layers 32 and 42 as shown in FIG. 10.

Figure 11:
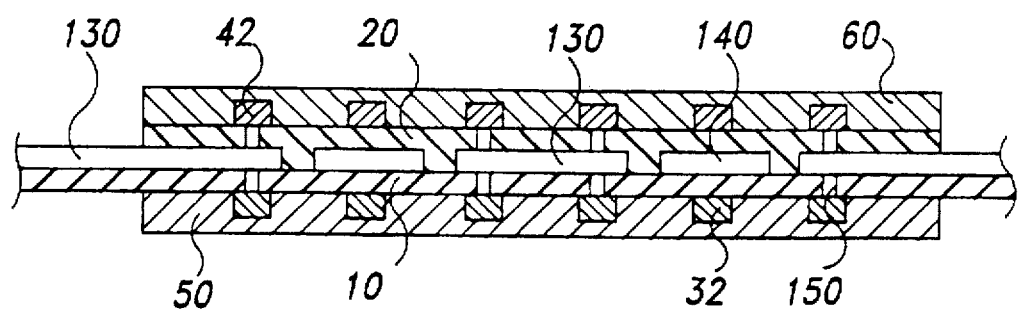

In order to protect the first and the second patterned metallization layers 32 and 42 from external environmental factors, a photo resist is applied on the lower and the upper surfaces of the first and the second patterned metallization layers 32 and 42 respectively, so that first and second outer insulation layers 50 and 60 are formed as shown in FIG. 11, which are used as passivation layers.

Figure 12:
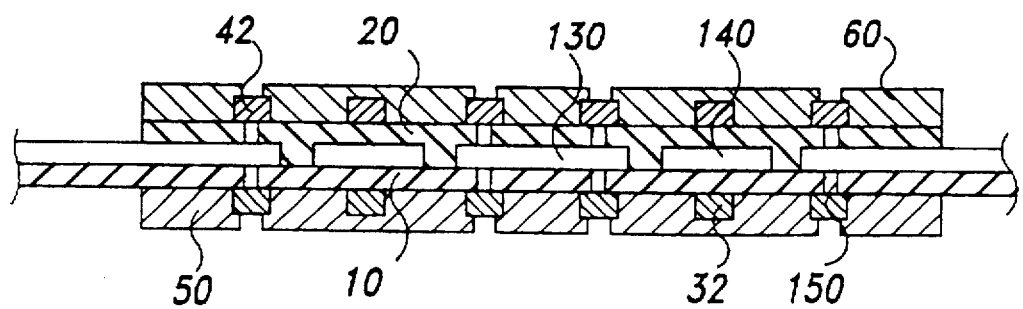

FIG. 12 is a cross sectional view showing that bonding areas of the first and the second patterned metallization layers 32 and 42 are respectively exposed to the outside by selectively removing the first and the second outer insulation layers 50 and 60, so that the bonding pads 312 and 322 of the chips 310 and 320 (see FIG. 13) are interconnected with the inner leads 132.

As stated above, after the raw material 200 for the lead frame goes through this series of steps, the lead frame can then be used in manufacturing the multichip package of the present invention. In this multichip package, the supporting portion 140 provides a mechanical support for the alternating patterned metallization layers and the insulation layers.

The lead frame according to the invention has advantages in that it can produce a fine pattern and a multiple pattern, for it is manufactured by using photolithography techniques as employed in conventional silicon wafer manufacturing processes.

Figure 13:
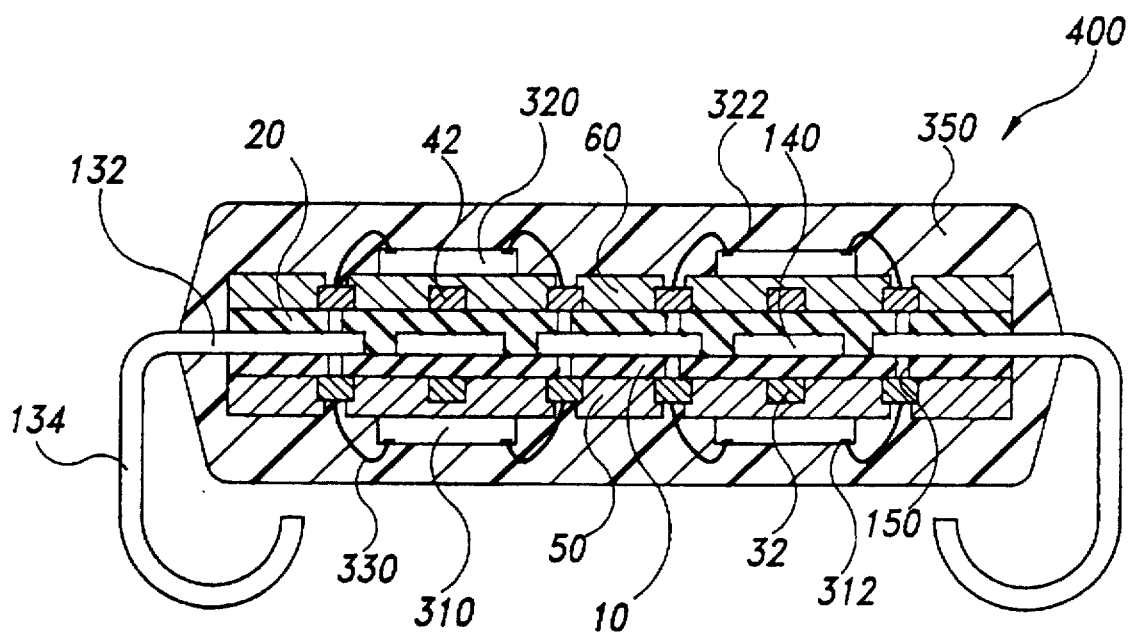
FIG. 13 is a cross sectional view of the multichip package device using the lead frame according to one embodiment of the present invention.

FIG. 13 is a cross sectional view of the multichip package device using the lead frame according to one embodiment of the present invention. Referring to FIG. 13, the multichip package 400 has a plurality of chips 310 and 320 having backsides attached to the lower and the upper surfaces of the first and the second outer insulation layers 50 and 60, respectively. Bonding pads 312 and 322 formed on the both sides of the active surfaces of the chips 310 and 320 are electrically interconnected to the first and the second patterned metallization layers 32 and 42 by bonding wires 330. Accordingly, the chips 310 and 320 are electrically interconnected to inner leads 132 through the via holes 150 and the first and the second patterned metallization layers 32 and 42.

In the package 400, the chips 310 and 320, the supporting portions 140, the inner leads 132, a portion of the tiebars 170, and electrical interconnection portion including bonding wires 330, are encapsulated with an encapsulant such as an epoxy molding compound (EMC) 350 for protecting them from external environmental factors. However, the outer leads 134 are exposed from the epoxy molding compound 350. Also, the non-encapsulated portions of the tiebars 170 are cut off to provide an individual package after the molding process. Herein, the outer leads 134 and inner leads 132 are in single body and electrically connected with an external electronic component such as a printed circuit board.

Figure 14:
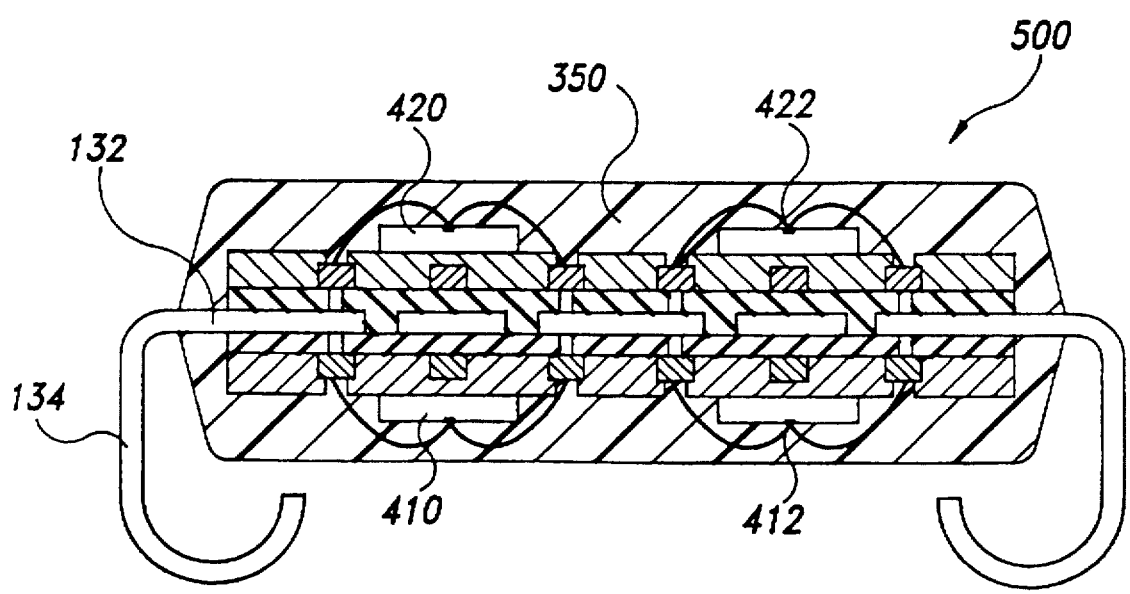
FIG. 14 is a cross sectional view of the multichip package device using the lead frame according to another embodiment of the present invention.

FIG. 14 is a cross sectional view of the multichip package device using the lead frame according to another embodiment of the present invention. Referring to FIG. 14, the multichip package device 500 has a structure similar to that of the multichip package device of FIG. 13 except that bonding pads 412 and 422 of chips 410 and 420 are disposed in the central region of the chips 410 and 420. Therefore, a detailed description of the like structural elements is omitted.

With the present invention, it is possible to reduce thickness of the package, since a fine pattern on the surface of the lead frame can be produced. Further, it is possible to increase the number of chips mounted on the lead frame due to the same fine pattern forming capabilities. Moreover, the present invention can provide a multichip package device which can reduce the production costs and the manufacturing steps for a multichip package, because it employs the conventional plastic assembly process with a novel lead frame comprising alternating patterned metallization layers and insulation layers rather than the separate common circuit base that was used in the conventional multichip package for interconnecting a plurality of chips.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims.

What is claimed is:

1. A multichip package device comprising:
   a lead frame having supporting portions and lead portions, said lead portions comprising inner leads and outer leads for electrically connecting the multichip package with an external electronic device;
   first and second inner insulation layers deposited on lower and upper surfaces of the lead frame, respectively;

via holes formed through the first and the second inner insulation layers;

first and second metallization layers deposited and patterned on lower and upper surfaces of the first and the second inner insulation layers, respectively;

first and second outer insulation layers deposited on lower and upper surfaces of the first and the second patterned metallization layers, respectively;

a plurality of chips, each having an active surface on which a plurality of bonding pads are formed, and wherein backsides of the chips are attached to lower and upper surfaces of the first and second outer insulation layers;

a plurality of bonding wires connected between the plurality of bonding pads and the inner leads through the via holes and the first and second patterned metallization layers; and an encapsulant for encapsulating the chips, the supporting portions and the inner leads of the lead portions.

2. The multichip package of claim 1, wherein said supporting portions and said lead portions of the lead frame are coplanar.

3. The multichip package of claim 2, wherein said first and second inner insulation layers, and said first and second outer insulation layers are made of a photo resist.

4. The multichip package of claim 1, wherein bonding areas of the first and the second patterned metallization layers are exposed to the outside by selectively removing portions of the first and second outer insulation layers, so that the bonding pads of the chips are interconnected with corresponding patterned metallization layers.

5. The multichip package of claim 1, wherein said inner leads are electrically interconnected with the corresponding via holes, said via holes being plated with a conductive material.

6. The multichip package of claim 1, wherein said encapsulant is an epoxy molding compound (EMC).

7. The multichip package of claim 1, wherein said bonding pads are centrally formed on each of said chips.

8. The multichip package of claim 1, wherein said bonding pads are formed on edge portions of said chips.

9. The multichip package of claim 1, wherein said lead frame is made of copper.

\* \* \* \* \*